United States Patent [19]
Schaefer

[11] 3,991,378
[45] Nov. 9, 1976

[54] ELECTRONIC PHASELOCK CIRCUITRY

[75] Inventor: Dietrich H. Schaefer, Marion, Iowa

[73] Assignee: Rockwell International Corporation, El Segundo, Calif.

[22] Filed: June 30, 1975

[21] Appl. No.: 591,542

[52] U.S. Cl. ............................... 329/122; 307/232; 329/104; 331/14
[51] Int. Cl.² ......................................... H03D 3/02
[58] Field of Search ............ 329/122, 104; 307/232; 331/27, 14

[56] References Cited
UNITED STATES PATENTS

| | | |
|---|---|---|
| 2,963,648 | 12/1960 | Baskin et al. ........................ 331/27 |
| 3,221,260 | 11/1965 | Henrion ............................. 329/123 |
| 3,821,470 | 6/1974 | Merrell ................................. 331/27 |
| 3,855,555 | 12/1974 | Burkhard ......................... 332/11 D |
| 3,921,092 | 11/1975 | Schatz.................................. 331/27 |

*Primary Examiner*—John Kominski
*Attorney, Agent, or Firm*—Terry M. Blackwood; Robert J. Crawford

[57] ABSTRACT

Phaselock circuitry including means for providing a frequency variable feedback signal and a phase detector receiving the input signal and the feedback signal. The phase detector provides pulses whose width and average value are dependent on the phase relationship between the input and feedback signals.

13 Claims, 4 Drawing Figures

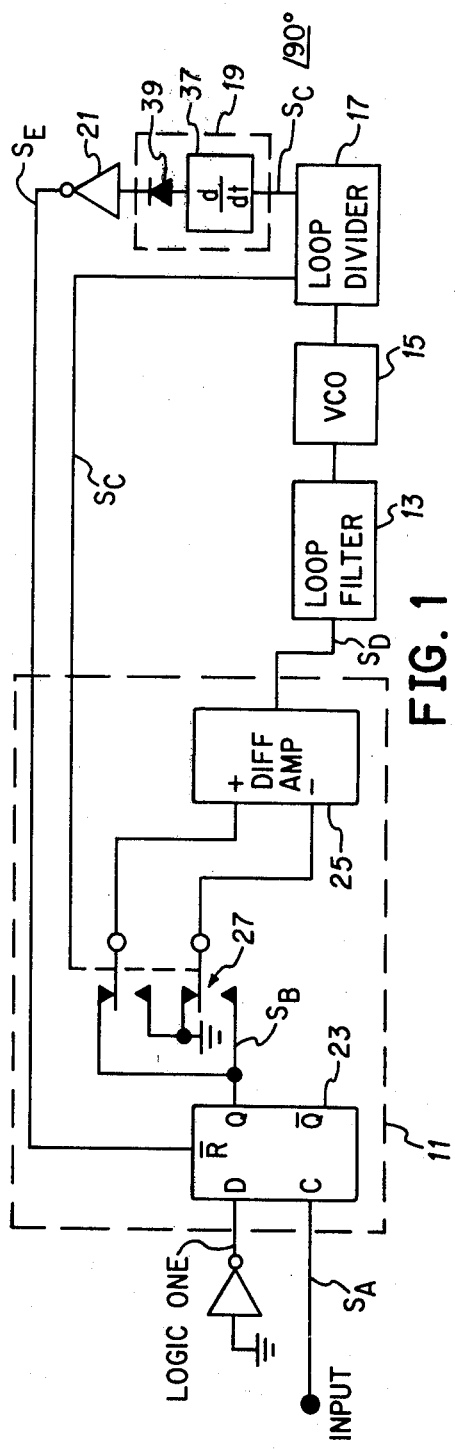
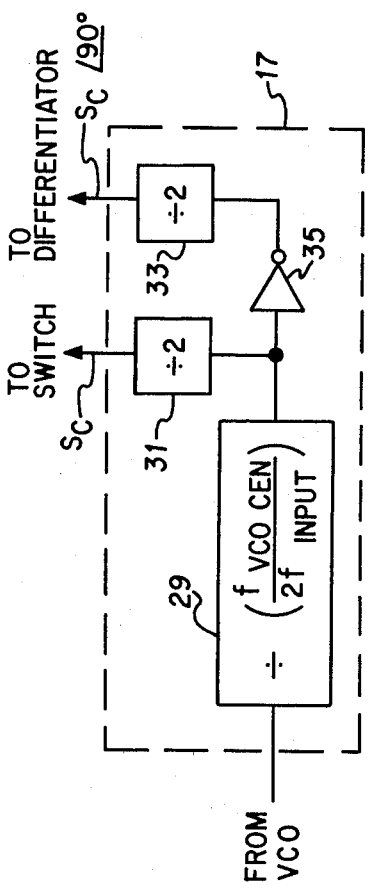
FIG. 1
FIG. 2

ELECTRONIC PHASELOCK CIRCUITRY

The invention herein described was made in the course of or under a contract or subcontract thereunder with The Department of the Air Force.

The present invention relates generally to electronic circuits and more specifically to phaselock loops.

In a variety of phaselock loop applications, it is desirable and/or necessary for a phaselock loop to maintain frequency lock even though the loop input signal fails to appear at the loop input for certain intervals of time. For instance, in ordinary PCM transmissions no separate pilot signal at the clock rate is transmitted and a local clock signal must be generated at the receiver from information contained in the data stream. To recover the timing, one may differentiate and then rectify the data and feed the result to a phaselock loop whose duty is to reconstruct, at the VCO output, the clock signal. (See Floyd M. Gardner's book "Phaselock Techniques," Wiley and Sons, Inc., 1966.) In such a case, the input to the phaselock loop appears as a periodic pulse train signal which randomly has some pulses missing and yet it is desirable that the loop maintain frequency lock.

To further illustrate, and in the context of the present application of this invention, it is essential that airborne circuits for deriving bearing information from a received TACAN signal be able to cope with occasional short-term signal dropouts. For phaselock loops whose duty it is to lock onto the 15 hertz or 135 hertz bearing-providing pulse trains, this means that the loop should maintain lock even though some of the pulses are missing.

In accordance with the present invention, a phaselock loop features insensitivity to short-term dropouts of the loop input signal. This and other features, objects, and advantages of the invention will become more apparent upon reference to the following specification, claims and appended drawings in which:

FIG. 1 is a schematic of the presently preferred embodiment of this invention,

FIG. 2 is a schematic of a portion of the FIG. 1 circuitry,

Figure 3:
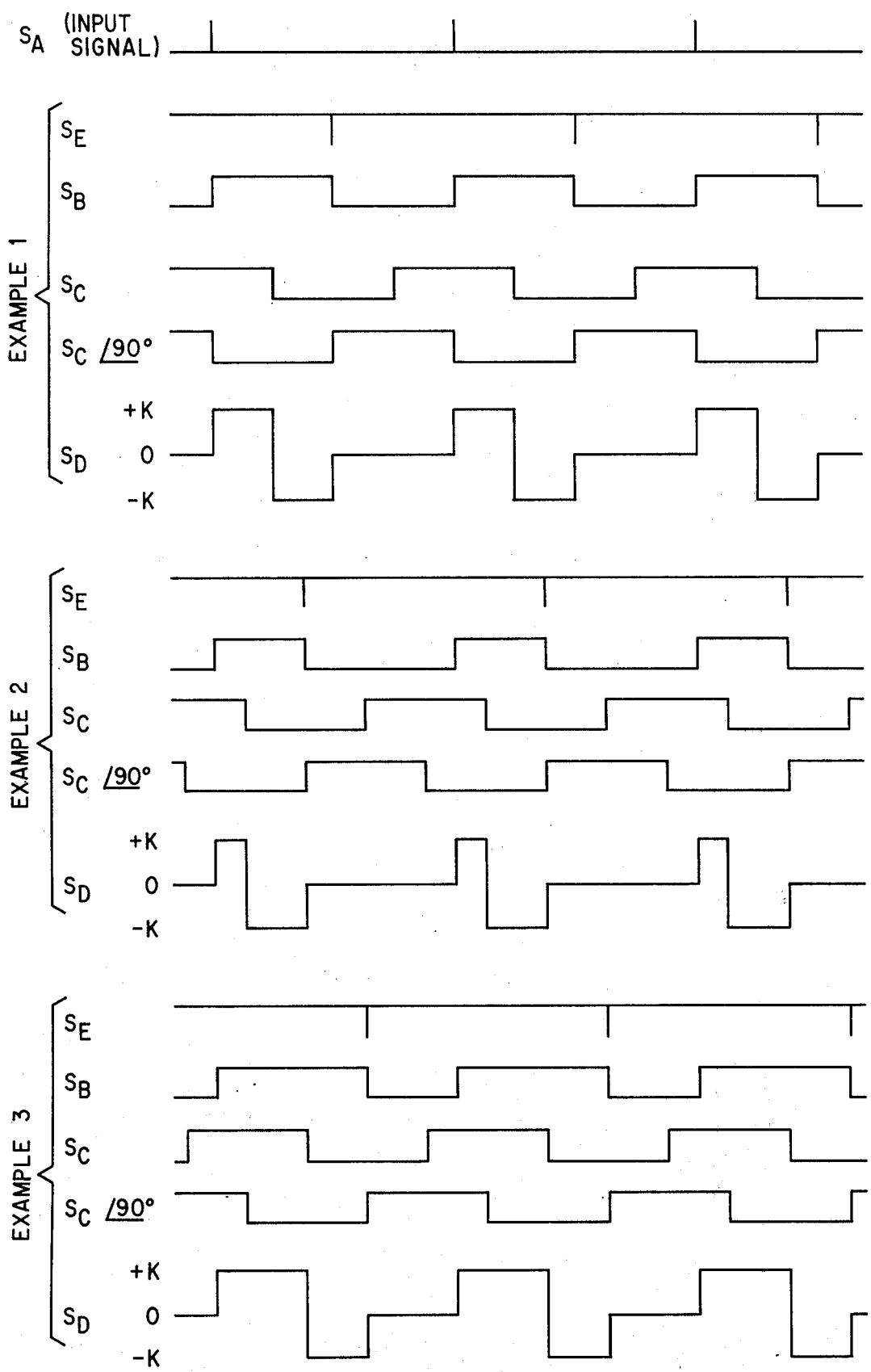
FIGS. 3 and 4 are waveforms useful in explaining the operation of the FIG. 1 circuitry.

In the presently preferred embodiment, illustrated in FIG. 1, phase detector 11, in response to a pulse train input signal $S_A$ and feedback Signals $S_C$ and $S_E$, provides to low-pass filter 13 width modulated pulse of which can have a positive or negative average value depending on the phase relationship between $S_A$ and $S_C$. Filter 13 in turn provides a dc signal which controls the voltage controlled oscillator 15 output frequency. A frequency divider 17 receives the VCO output and provides, in conjunction with a wave-shaping circuit 19 and inverter 21, the two feedback signals $S_C$ and $S_E$. It should here be noted that the term "average" will be used herein in the sense that the average value of a periodic and continuous function is directly proportional to the integral of that function over one period of that function. In the preferred embodiment, the average value of the width modulated pulses delivered to filter 13 in the loop lock condition is zero.

Phase detector 11 comprises a flip-flop 23, a differential amplifier 25, and a switch 27 for connecting the flip-flop output alternately with one of the differential amplifier inputs. More particularly, flip-flop 23 is a D or "delay" type flip-flop which, as is well known in the art, transfers to the Q output when a pulse is present at the clock input C, whatever data is at the D input. Moreover, a logic zero at the $\overline{R}$ input overrides all other inputs and makes the Q output a logic zero. Connected to the C, D, and $\overline{R}$ inputs of flip-flop 23 are, respectively, the input signal $S_A$, a logic one, and feedback signal $S_E$. The Q output of flip-flop 23 is electrically connected through switch 27 to one of either the non-inverting input or the inverting input of differential amplifier 25 while the other differential amplifier input is connected also through switch 27, to ground. Switch 27, although it may of course be variously embodied, preferably comprises a pair of transistors, one NPN and the other PNP and each being in common-collector configuration.

The differential amplifier 25 output is passed through filter 13 to VCO 15. Filter 13 is a low-pass loop filter tailored to the particular filtering requirements of the input signal. The filter not only sets the bandwidth of the phaselock loop but also provides filtering of the phase detector output signal adequate to prevent any one signal from reaching the VCO input. (Such a signal would cause the VCO output to vary in frequency about its desired output frequency which in turn could cause loss of lock if the frequency deviations were severe enough or could prevent the loop from ever locking up.) As a preferred minimum, the low-pass loop filter is flat from zero to approximately 0.25 times the desired loop 3 dB bandwidth and then attenuates at 6 dB per octave. In the preferred embodiment, the loop filter contains an integrator to provide large amounts of dc gain, a high-pass section to provide proper loop damping, and two low-pass sections with their corner frequency appropriately removed (a minimum factor of 4) from the corner frequency of the high-pass section to minimize their effect on loop dynamics. VCO 15 may be variously embodied and preferably comprises a voltage controlled astable multivibrator whose center frequency for a zero volt input level is nominally an even multiple of the frequency of the input signal $S_A$, and whose frequency is variable both above and below this nominal or center frequency.

The output of VCO 15 is fed into loop divider 17 which provides two signals designated in FIG. 1 as $S_C$ and $S_C/90°$. Loop divider 17, illustrated in more detail in FIG. 2, comprises flip-flops appropriately coupled to form frequency dividers 29, 31, and 33 which respectively provide division by M, division by 2, and division by 2. M is equal to $(f_{vcocen}/2f_{input})$ where $f_{vcocen}$ is the VCO nominal or center frequency and $f_{input}$ is the input signal frequency and thus divider 29 provides an output whose freqeuncy is nominally $2Xf_{input}$. The output of divider 29 is coupled directly to the input of divider 31 and via inverter 35 to the input of divider 33. The outputs $S_C$ and $S_C/90°$ of dividers 31 and 33 are of the same frequency which is nominally the same as the input signal frequency, and are phase shifted by 90° with respect to one another. As seen in FIG. 1, $S_C$ is coupled directly to the control input of switch 27; i.e., to the bases of the two transistors in the preferred switch embodiment. $S_C/90°$ is coupled through differentiator 37, rectifier 39, and inverter 21 to the $\overline{R}$ input of flip-flop 23.

For a description of the operation of the FIG. 1 apparatus, reference will also be made to FIG. 3 which illustrates, for three different conditions, signals $S_B$, $S_C$, $S_C/90°$, $S_D$, and $S_E$ which are developed in response to input signal $S_A$. Example 1 of FIG. 3 represents a frequency and phaselock condition. Examples 2 and 3 represent a frequency lock condition where each $S_C$ thereof leads and lags respectively the $S_C$ of the phaselock condition. From the figures it is seen that the output $S_B$ of flip-flop 23 becomes a logic one at the occurrence of an input pulse of $S_A$ and remains a logic one until the occurrence of a resetting feedback pulse of $S_E$ at which time $S_B$ returns to a logic zero. As further seen from the FIGS. 1 and 3, $S_E$ is related to $S_C/90°$ such that each $S_E$ pulse occurs at a positive going transition of $S_C/90°$. Also, switch 27 operates in accordance with $S_C$ such that when $S_C$ is a logic one, switch 27 is in the "up" position illustrated in FIG. 1, and when $S_C$ is a logic zero, switch 27 is in the other, or "down," position. Thus, $S_D$ is dependent on $S_B$ and also $S_C$ in accordance with logic Table 1, below, which shows the state of $S_D$ for the various combinations of logic states of $S_B$ and $S_C$.

TABLE 1

| $S_B$ | $S_C$ | $S_D$ |
|---|---|---|
| 0 | 0 | 0 |
| 0 | 1 | 0 |
| 1 | 0 | −K |
| 1 | 1 | +K |

It is seen from FIG. 3 that the $S_B$ logic one levels or pulses are width modulated pulses whose average value, although dependent on the phase difference between $S_A$ and $S_C$ (or $S_A$ and $S_E$), is always positive. The $S_D$ pulses are width modulated pulses of the same duration as the $S_B$ pulses and, as seen in FIG. 3, may have positive or negative average value depending on the phase difference between $S_A$ and $S_C$ (or $S_A$ and $S_E$). More particularly, the $S_D$ pulses are bipolar having both positive and negative going portions as shown in FIG. 3, when $S_E$ lags $S_A$ by at least 90° and portions as shown in FIG. 3, when $S_E$ lags $S_A$ by at least 90° and no more than 360°. The $S_D$ pulses are unipolar, being only negative going, when $S_E$ lags $S_A$ by from 0° to 90°. Whether bipolar or unipolar, the absolute value of the instantaneous amplitude of the $S_D$ pulses is equal to the constant K.

Summarizing for the preferred embodiment, each width modulated pulse of $S_D$ is initiated by an $S_A$ pulse, is terminated by an $S_E$ pulse, and has an average value which may be positive or negative and which is determined by and representative of the phase of $S_C$. When the loop is locked, and frequency of $S_E$ and $S_C$ is equal to the frequency of $S_A$, the average value of $S_D$ is zero, and $S_C$ is in quadrature with $S_A$. The average value of $S_D$ is positive or negative when the switch commutating signal lags or leads the quadrature relationship respectively.

More particularly, as seen in example 1, when frequency and phaselock conditions prevail, $S_C$ and $S_E$ are shifted with respect to $S_A$ by 90° and 180° respectively and the average value of each $S_D$ width modulated pulse is zero. In example 2, $S_C$ leads the $S_C$ of example 1 by 45° and the average value of each $S_D$ width modulated pulse is negative. In example 3, $S_C$ lags the $S_C$ of example 1 by 45° and the average value of each $S_D$ width modulated pulse is positive. In each of examples 2 and 3, of course, the loop filter will develop and provide a voltage to the VCO input which will produce an appropriate change in the VCO output and thus will cause $S_C$ and $S_E$ to shift to the phaselock condition as shown in example 1.

Figure 4:
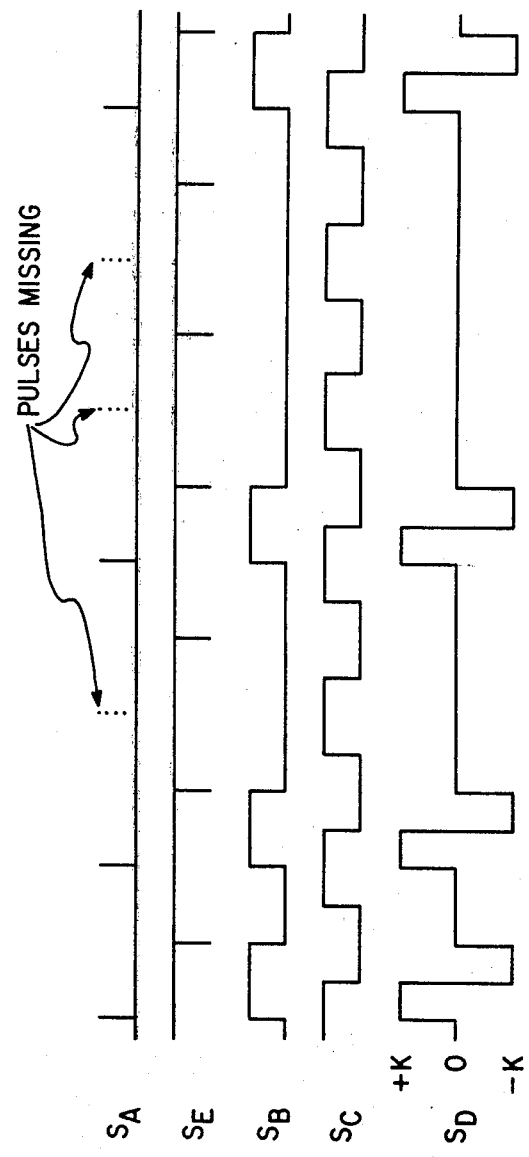

FIG. 4, which assumes a frequency and phaselock condition, illustrates how the FIG. 1 circuitry reacts when some of the input pulses are missing. (In this figure, the third, fifth, and sixth input pulses are assumed missing and the dotted lines represent the location of these pulses had they been present.) As seen therein, for the assumed lock condition, when an input pulse is present, an $S_D$ pulse of zero average value is produced. When an input pulse is absent, $S_B$ remains a logic zero and no $S_D$ pulse is produced. Thus the average value of $S_D$ remains zero, the VCO remains unchanged, and loop lock is maintained. The only effect the missing pulses have is in the reduction of phase detector gain. It should be apparent from the figures that the gain of the phase detector is maximized at ±90° and the phase detector is continuous over a full ±180°.

It should also be apparent that the inventive principles herein are not limited to the above-described preferred embodiment. For instance, a commutating frequency (i.e., the frequency of $S_C$) higher than the frequency of $S_E$ can produce results similar to those of the preferred embodiment. For example, if $S_E$ were maintained as illustrated and the frequency of $S_C$ were three times that of $S_E$ (instead of being equal as in the preferred embodiment), (f) the width modulated pulses of $S_D$ would, for the three examples of FIG. 3, change polarities more than once, (ii) the phase detector would be continuous over ±60° with gain maximized at ±30°, and (iii) the gain (e.g., in volts per degree) of the phase detector would be unchanged. Divider Implementations for achieving the various frequency divisions and for providing such frequencies of $S_C$ would be apparent to those skilled in the art.

Also, the positive going magnitude of the $S_D$ pulses need not be the same as the negative going magnitude. In such an instance, the loop would, of course, lock when $S_D$ averaged zero but this conditon would occur at a phase relationship between $S_A$ and $S_C$ other than the illustrated quadrature relationship. Also, the relationship between $S_C$ and $S_E$ need not be 90°. However, depending on the positive and negative magnitudes of $S_D$, the phase between $S_A$ and $S_C$ in the loop lock condition would likely be other than 90°. Also, depending on the particular implementation it might be desirable to rebias $S_D$ so that the $S_D$ waveform moves with respect to a predetermined and constant reference level other than zero. Such reference level could be either positive or negative. Also, the phase detector input signal $S_A$ may vary in pulse width, without affecting the phase detector operation, from extremely narrow to extremely broad; all that is necessary in this respect is that there be sufficient time to recognize the input signal transitions.

Thus, while a particular embodiment of the present invention has been shown and/or described, it is apparent that changes and modifications may be made therein without departing from the invention in its broader aspects. The aim of the appended claims, therefore, is to cover all such changes and modifications as fall within the true spirit and scope of the invention.

What is claimed is:
1. For use with a pulse train input signal of fixed frequency, phaselock circuitry comprising:

a. first means, including controllable oscillator means, for providing first and second feedback signals of first and second frequencies where said first and second frequencies are variable and determined by the first means input signal level, b. phase detector second means receiving said input signal and said first and second feedback signals and comprising means for outputting width modulated pulses, each width modulated pulse being initiated by an input pulse, each width modulated pulse being terminated by said first feedback signal, and each width modulated pulse having an average value, ± a predetermined and constant reference level, determined by and indicative of the phase relationship between said input signal and said second feedback signal, said phase detector means providing an output of substantially said reference level during each period where an input pulse is absent, and c. third means for receiving the output of said second means and delivering to the input of said first means a signal for controlling the frequency and phase of said first and second feedback signals in accordance with said average value, taken with respect to said reference level, of said width modulated pulses.

2. Circuitry as defined in claim 1 wherein said first frequency is equal to said second frequency and said first and second signals are phase shifted with respect to one another by a predetermined and constant phase angle.

3. Circuitry as defined in claim 2 wherein said reference level is zero and the absolute value of the amplitude of each said width modulated pulse is predetermined and constant.

4. Circuitry as defined in claim 1 wherein said third means includes a low-pass filter.

5. Circuitry as defined in claim 1 wherein said first means includes frequency divider means for developing, in response to the output of said oscillator means, said first and second signals.

6. For locking onto an input signal comprising a pulse train of fixed frequency $f_i$, phaselock circuitry comprising:

first means, including voltage controllable oscillator means, for providing first and second frequency variable signals, said first and second signals having the same frequency and being phase shifted with respect to one another by a constant and predetermined phase angle $\phi_1$, second means, comprising bistable multivibrator means, connected for receiving at separate inputs said input signal and said first signal, and outputting in response to an input pulse a first logic level and then in response to said first signal a second logic level, third means connected for receiving said second signal and the output of said second means and comprising means for converting each said first logic level into a width modulated pulse having the same duration as the first logic level and having an average value determined by said second signal, fourth means connected between said third means and said first means for controlling the frequency of said first means in accordance with the average value of the width modulated pulses produced by said third means, said first, second, third, and fourth means cooperating such that in the lock condition, the frequency of said first and second signals is substantially equal to $f_i$ and said first signal is phase shifted with respect to said input signal by a constant and predetermined phase angle $\phi_2$.

7. Circuitry as defined in claim 6 wherein the absolute value of the amplitude of each said width modulated pulse is predetermined and constant.

8. Circuitry as defined in claim 7 wherein each of said phase angles $\phi_1$ and $\phi_2$ is substantially 90°.

9. Circuitry as defined in claim 6 wherein said third means includes switching means responsive to said second signal.

10. Circuitry as defined in claim 6 wherein said fourth means includes low-pass filter means.

11. Circuitry as defined in claim 6 wherein said first means includes frequency dividing means.

12. Circuitry as defined in claim 6 wherein said first logic level is a nonzero logic level, and said second logic level is a zero logic level.

13. Phase detector means for providing a signal indicative of the phase difference between first and second input signals where a third phase shifted from said second signal by a predetermined amount is available, said phase detector means comprising:

bistable multivibrator means having first and second input means and an output means, said first and second input means providing means for receiving said first and second signals, differential amplifier means having inverting and noninverting input means and an output means, and switching means responsive to said third signal and providing electrical connection between said bistable multivibrator output means and alternately, as controlled by said third signal, one of either said inverting input means or said noninverting input means.

* * * * *

UNITED STATES PATENT OFFICE
CERTIFICATE OF CORRECTION

PATENT NO. : 3,991,378
DATED : November 9, 1976
INVENTOR(S) : Dietrich H. Schaefer It is certified that error appears in the above-identified patent and that said Letters Patent are hereby corrected as shown below:

Column 1, line 18, after the word "data" and before the word "and", insert the word --stream--.
Column 1, line 50, delete "pulse" and substitute therefor --pulses each--.
Column 2, line 46, delete "$S_C/90°$" and substitute therefor --$S_C\underline{/90°}$--.

Column 2, line 56, delete "$S_C/90°$" and substitute therefor --$S_C\underline{/90°}$--.

Column 2, lines 62 and 69, delete "$S_C/90°$" and substitute therefor --$S_C\underline{/90°}$--.

Column 2, line 67, after the word "different" and before the word "conditions", insert the word --loop--.
Column 2, line 68, delete "$S_C/90°$" and substitute therefor --$S_C\underline{/90°}$--.

Column 3, lines 10 and 12, delete "$S_C/90°$" and substitute therefor --$S_C\underline{/90°}$--.

Column 3, lines 39 and 40, after the word "and" in line 39, delete --portions as shown in Fig. 3, when $S_E$ lags $S_A$ by at least 90° and--.

Column 4, line 28, delete "(f)" and substitute therefor --(i)--.
Column 4, line 34, delete "Implementations" and substitute therefor --implementations--.
Continued on Page 2

UNITED STATES PATENT OFFICE
CERTIFICATE OF CORRECTION

PATENT NO. : 3,991,378
DATED : November 9, 1976
INVENTOR(S) : Dietrich H. Schaefer It is certified that error appears in the above-identified patent and that said Letters Patent are hereby corrected as shown below:

In the third line of claim 13, after the word "third" and before the word "phase", insert the word --signal--.

Signed and Sealed this

First Day of February 1977

[SEAL]

Attest:

RUTH C. MASON
Attesting Officer

C. MARSHALL DANN
Commissioner of Patents and Trademarks